(12) United States Patent
Zeidler et al.

(10) Patent No.: US 12,255,040 B2
(45) Date of Patent: Mar. 18, 2025

(54) MULTI-BEAM PARTICLE BEAM SYSTEM AND METHOD FOR OPERATING SAME

(71) Applicant: Carl Zeiss MultiSEM GmbH, Oberkochen (DE)

(72) Inventors: Dirk Zeidler, Oberkochen (DE); Christof Riedesel, Aalen (DE); Arne Thoma, Aalen (DE); Georgo Metalidis, Koenigsbronn-Zang (DE); Joerg Jacobi, Herbrechtingen (DE); Stefan Schubert, Oberkochen (DE); Ralf Lenke, Lauchheim (DE); Ulrich Bihr, Kirchheim/Dirgenheim (DE); Yanko Sarov, Aalen (DE); Georg Kurij, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 1025 days.

(21) Appl. No.: 17/215,995

(22) Filed: Mar. 29, 2021

(65) Prior Publication Data

US 2021/0217577 A1 Jul. 15, 2021

Related U.S. Application Data

(63) Continuation of application No. PCT/EP2019/076472, filed on Sep. 30, 2019.

(30) Foreign Application Priority Data

Oct. 1, 2018 (DE) .......................... 102018124219.0

(51) Int. Cl.
*H01J 37/147* (2006.01)
*H01J 37/09* (2006.01)
(Continued)

(52) U.S. Cl.
CPC .......... *H01J 37/1475* (2013.01); *H01J 37/09* (2013.01); *H01J 37/141* (2013.01); *H01J 37/153* (2013.01);
(Continued)

(58) Field of Classification Search
None
See application file for complete search history.

(56) References Cited

U.S. PATENT DOCUMENTS

| 4,130,761 A | 12/1978 | Matsuda |
| 4,153,843 A | 5/1979 | Pease |

(Continued)

FOREIGN PATENT DOCUMENTS

| CN | 88100700 A | 8/1988 |
| DE | 102013014976 A1 | 3/2015 |

(Continued)

OTHER PUBLICATIONS

Korean Office Action, with translation thereof, for Korean Application No. 10-2021-7012661, dated Dec. 20, 2022.
(Continued)

*Primary Examiner* — Ashok Patel
(74) *Attorney, Agent, or Firm* — Fish & Richardson P.C.

(57) ABSTRACT

A method of operating a multi-beam particle beam system includes: generating a multiplicity of particle beams such that they each pass through multipole elements that are either intact or defective; focusing the particle beams in a predetermined plane; determining excitations for the deflection elements of the multipole elements; exciting the deflection elements of the multipole elements that are intact with the determined excitations; modifying the determined excitations for the deflection elements of the multipole elements that are defective; and exciting the deflection elements of the defective multipole elements with the modified excitations.

(Continued)

Modifying the determined excitations includes adding corrective excitations to the determined excitations. The corrective excitations are the same for all deflection elements of the defective multipole element.

20 Claims, 9 Drawing Sheets

(51) Int. Cl.
  *H01J 37/141* (2006.01)
  *H01J 37/153* (2006.01)
  *H01J 37/28* (2006.01)
(52) U.S. Cl.
  CPC ....... *H01J 37/28* (2013.01); *H01J 2237/0453* (2013.01); *H01J 2237/1532* (2013.01); *H01J 2237/24564* (2013.01)

(56) References Cited

U.S. PATENT DOCUMENTS

| | | | |
|---|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,729,493 B2 | 5/2014 | Ohishi |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2005/0087701 A1 | 4/2005 | Lammer-Pachlinger |
| 2006/0289804 A1 | 12/2006 | Knippelmeyer |
| 2009/0014649 A1 | 1/2009 | Nakasuji |
| 2009/0114818 A1 | 5/2009 | Casares |
| 2009/0159810 A1 | 6/2009 | Knippelmeyer |
| 2009/0256075 A1 | 10/2009 | Kemen |
| 2010/0178602 A1 | 7/2010 | Seto |
| 2014/0197325 A1 | 7/2014 | Kato |
| 2015/0021493 A1 | 1/2015 | Platzgummer |
| 2015/0069235 A1 | 3/2015 | Kemen |
| 2015/0069260 A1 | 3/2015 | Platzgummer |
| 2015/0083911 A1 | 3/2015 | Zeidler |
| 2015/0311031 A1 | 10/2015 | Platzgummer |
| 2015/0348738 A1 | 12/2015 | Zeidler |
| 2016/0336147 A1 | 11/2016 | Platzgummer |
| 2017/0125205 A1 | 5/2017 | Liu |
| 2017/0133198 A1 | 5/2017 | Kruit |
| 2017/0154756 A1 | 6/2017 | Ren |
| 2017/0309449 A1 | 10/2017 | Ren |
| 2017/0345612 A1 | 11/2017 | Touya et al. |
| 2019/0333732 A1 | 10/2019 | Ren |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |
| 2021/0142980 A1* | 5/2021 | Zeidler .................. H01J 37/14 |

FOREIGN PATENT DOCUMENTS

| | | |
|---|---|---|
| DE | 102013016113 A1 | 3/2015 |
| DE | 102014008083 A1 | 12/2015 |
| EP | 2854153 * | 1/2015 |
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2002237270 A | 8/2002 |
| JP | 2004-265864 A | 9/2004 |
| JP | 2009-032691 A | 2/2009 |
| JP | 2010-020919 A | 1/2010 |
| JP | 2014229481 A | 12/2014 |
| JP | 2015-23286 A | 2/2015 |

(56) References Cited

FOREIGN PATENT DOCUMENTS

| | | | |
|---|---|---|---|
| JP | 2018-513543 A | 5/2018 | |
| WO | WO2005024881 A2 | 3/2005 | |
| WO | WO2007028595 A2 | 3/2007 | |
| WO | WO2007028596 A1 | 3/2007 | |
| WO | WO2007060017 A2 | 5/2007 | |
| WO | WO2013032949 A1 | 3/2013 | |
| WO | WO2017095908 A1 | 6/2017 | |
| WO | WO2020057678 A1 | 3/2020 | |
| WO | WO2020064035 A1 | 4/2020 | |
| WO | WO2020065094 A1 | 4/2020 | |
| WO | WO2020070074 A1 | 4/2020 | |
| WO | WO2020151904 A2 | 7/2020 | |
| WO | WO2020249147 A1 | 12/2020 | |

OTHER PUBLICATIONS

Japanese Patent Office, with translation thereof, for corresponding JP Appl No. 2020-000167, dated Jul. 23, 2024.

German Office Action, with translation thereof, for corresponding DE application No. 10 2018 124 219.0 dated Jun. 11, 2019.

I. L. Berry et al., "Programmable aperture plate for maskless high-throughput nanolithography", Journal of Vacuum Science & Technology B: Microelectronics and Nanometer Structures Processing, Measurement, and Phenomena 15 (1997), pp. 2382-2386.

International search report (translation will follow) for corresponding international application No. PCT/EP2019/076472 dated Jan. 8, 2020.

Chinese Office Action, with translation thereof, for corresponding CN application No. 201980064424.5, dated Dec. 28, 2023.

International preliminary report on patentability for corresponding international application No. PCT/EP2019/076472 dated Apr. 15, 2021.

Japanese Patent Office, with translation thereof, for corresponding JP Appl No. 2023-000167, dated Jan. 24, 2024.

Korean Office Action, with translation thereof, for corresponding KR Appl 10-2023-7031206, dated Jul. 20, 2024.

Japanese Office Action, with translation thereof, for corresponding JP Appl No. 2021-518111, dated Feb. 24, 2022.

* cited by examiner

MULTI-BEAM PARTICLE BEAM SYSTEM AND METHOD FOR OPERATING SAME

CROSS-REFERENCE TO RELATED APPLICATION

The present application is a continuation of, and claims benefit under 35 USC 120 to, international application PCT/EP2019/076472, filed Sep. 30, 2019, which claims benefit under 35 USC 119 of German Application No. 10 2018 124 219.0, filed Oct. 1, 2018. The entire disclosure of these applications are incorporated by reference herein.

FIELD

The disclosure relates to multi-beam particle beam systems which operate with a multiplicity of particle beams, and to methods for operating multi-beam particle beam systems.

BACKGROUND

US 2015/0348738 A1 discloses multi-beam particle beam systems that use a plurality of multi-aperture plates to split a particle beam into a multiplicity of particle beams and to influence individual particle beams of the multiplicity of particle beams by providing electric fields. For example, ring electrodes are used at openings in a multi-aperture plate through which particle beams pass, to provide electrostatic fields that focus the particle beam, and electrodes arranged distributed around the openings in the circumferential direction are used to provide dipole or quadrupole fields in order to act as beam deflectors or stigmators on the particle beam.

It can be desirable to this end to supply the multiplicity of electrodes, which are mounted on the openings in multi-aperture plates in order to influence the particle beams, with settable voltages. Since there is a general desire to increase the number of particle beams with which multi-beam particle beam systems can operate, a very large number of electrodes at multi-aperture plates may need to be supplied with voltages. Multi-aperture plates, the openings of which are provided with electrodes, are relatively complex components whose production can involve great outlay. Errors that inevitably occur during the production can lead to one or more electrodes being defective, and therefore their voltage may not be able to be adjusted to the desired values during operation. If only one electrode of the many electrodes of a multi-aperture plate is defective, this usually means that the entire multi-aperture plate is defective and cannot be used. Defects occurring at individual electrodes of a multi-aperture plate during operation can also result in the entire multi-aperture plate having to be replaced. A rejection rate in the production of multi-aperture plates that is perceived as too high and a probability of failure that is perceived as too high during the operation of multi-aperture plates is apparently acceptable here. A possible way out of this situation lies in the development of more reliable production methods for multi-aperture plates, which may also be more complex.

SUMMARY

The present disclosure proposes multi-beam particle beam systems and methods for their operation which reduce the desired properties placed on the production method of multi-aperture plates with regard to defects in individual electrodes.

According to embodiments of the disclosure, a method for operating a multi-beam particle beam system includes generating a multiplicity of particle beams in such a way that each particle beam of the multiplicity of particle beams traverses a multipole element, wherein each multipole element has a plurality of deflection elements that are arranged distributed in the circumferential direction around a center of the multipole element, and wherein each of the multipole elements is either intact or defective.

The multiplicity of particle beams can be generated in a variety of ways. For example, a particle beam can be generated with the aid of a particle emitter directed at a multi-aperture plate having a multiplicity of openings, such that the multiplicity of particle beams are generated in the beam path downstream of the multi-aperture plate. Furthermore, a multiplicity of particle emitters can be provided, wherein each particle emitter generates one of the multiplicity of particle beams.

The particle beam system typically includes a particle optical unit which directs the multiplicity of particle beams at an object and focuses them there. The particle optical unit does not have to be free of faults and can be subject to aberrations. One of the aberrations is, for example, an astigmatism, the effect of which on any given particle beam of the multiplicity of particle beams that form a beam bundle generally depends on the position of the particle beam within the beam bundle.

In order to at least partially compensate for the effect of aberrations on the individual particle beams, the multipole elements are provided, with one of the particle beams passing through each of the multipole elements. The deflection elements of the multipole element, which are arranged distributed in the circumferential direction around a center of the multipole element, are excited during operation in order to generate fields that influence the particle beam passing through the multipole element by deflecting the individual particles of the particle beam. The fields influencing the particle beam can be electric fields and/or magnetic fields. Accordingly, the deflection elements may include electrodes for generating electric fields and coils for generating magnetic fields. The deflection elements can then be excited in such a way that focusing of each of the particle beams in a predetermined plane satisfies at least one predetermined criterion. The predetermined plane can be, for example, the surface of an object at which the particle beams are directed. The predetermined criterion can involve, for example, that the respective particle beam is focused in the predetermined plane such that the cross section of the particle beam in this plane is as small as possible or has a predetermined value, or that the shape of the cross section has a deviation from a circular shape that is less than a limit value. Other criteria are possible.

An exemplary multipole element has two electrodes, which are arranged opposite one another with respect to the center of the multipole element and can be excited in such a way that the multipole element acts on the particle beam passing through it like a beam deflector, which deflects the particle beam by an angle that is settable by way of the excitations. A further exemplary multipole element has four electrodes, which are arranged in the circumferential direction around the center of the multipole element and can be excited in such a way that the multipole element acts on the particle beam passing through it like a beam deflector, which deflects the particle beam by an angle that is settable by way of the excitations and deflects it in a direction that is settable by way of the excitations, or that the multipole element acts on the particle beam passing through it like a stigmator, which astigmatically influences the particle beam with a strength that is settable by way of the excitations. A further exemplary multipole element has eight electrodes, which are arranged in the circumferential direction around the center of the multipole element and can be excited in such a way that the multipole element acts on the particle beam passing through it like a stigmator, which astigmatically influences the particle beam with a strength and orientation that are settable by way of the excitations.

In order to excite the deflection elements during operation of the particle beam system, a controller can be provided, which supplies the deflection elements with the excitations. The excitations can be passed from the controller to the individual deflection elements via electrical lines. If the deflection elements are electrodes, the electrical lines are electrically conductive connections suitable for conducting a voltage provided by the controller to the respective electrode. If the deflection elements are coils, the lines are electrically conductive connections able to conduct a current that is desired for the excitation of the coil to the coil.

During the production of the multi-aperture plate or during the operation of the multi-aperture plate, faults can occur that result in individual multipole elements not being intact but rather defective. For example, a single deflection element of the multipole element can be defective in that it is not able to be excited as desired during operation. For example, an electrical line that leads to the relevant deflection element can have a line interruption. For example, an electrode that forms the deflection element in question can have an insulation defect, with the result that this electrode is conductively connected to the multi-aperture plate or to another electrode and for this reason cannot assume a desired voltage. For example, a coil that forms a given deflection element can have a line interruption or a short circuit, with the result that a current flow having a desired strength through this coil is not possible.

The method further includes determining excitations for the deflection elements of the multipole elements in order to influence the particle beams passing through the multipole elements, wherein the excitations for the deflection elements of each of the multipole elements are determined such that they influence the particle beam passing through the multipole element in a desired manner.

The method may further include exciting the deflection elements of the multipole elements that are intact with the determined excitations.

In order to excite the deflection elements of the multipole elements during operation in such a way that they advantageously influence the individual particle beams, the excitations for this may be determined. According to exemplary embodiments, for this purpose, for each of the multipole elements a variable representing a desired influencing of the particle beam passing through the multipole element is determined. The at least one variable can include, for example, the extent of a beam astigmatism that the particle beam exhibits when it is incident on an object. The excitations of the individual deflection elements of a multipole element that is in the form of a stigmator and through which the particle beam passes can then be determined in such a way that, when the deflection elements of the stigmator are excited with the determined excitations, the effect of the deflection elements on the particle beam passing through the stigmator is such that the influencing of the particle beam represented by the at least one variable is achieved.

The excitations of the deflection elements of each multipole element can for example be determined such that an average value of the excitations of the multipole element has a value that is the same for all multipole elements. The average value can be calculated as the arithmetic mean of the excitations of the deflection elements of the multipole element. For example, if the deflection elements are electrodes, determining the excitations includes determining voltages, and exciting the deflection elements includes applying the determined voltages to the electrodes. The average value of the excitations is then given by the average value of the voltages applied to the electrodes. If the average value is the same for all multipole elements that are operated, for example, as stigmators, the effects of the individual multipole elements or stigmators differ only in terms of their deflection and stigmation effects on the individual particle beams, but not in terms of their focusing effects on the particle beams.

The deflection elements of the multipole elements that are intact can then be excited with the excitations determined as described above.

The method may further include modifying the determined excitations for the deflection elements of at least one multipole element of the multipole elements that are defective and exciting the electrodes of the defective multipole element with the modified excitations.

If a multipole element is defective, it will not be possible to excite the deflection elements of the defective multipole element with the excitations that were determined as described above. Due to the defect of an individual deflection element, it may not be possible, for example, to excite this deflection element with the excitation that has been determined for this deflection element. In this case, the previously determined excitations are modified with the aim of actually being able to excite the deflection elements of the multipole element with the modified excitations and nevertheless to achieve influencing of the particle beam passing through the defective multipole element that at least partially achieves the original aim of the influencing, such as for example, the compensation of a beam astigmatism. The modification of the excitations of the deflection elements of the defective multipole element takes into account the fact that, for example, the excitation of one of the deflection elements is not freely settable but rather specified.

According to exemplary embodiments, modifying the determined excitations includes determining the modified excitations such that the defective deflection element is excited such that its excitation is equal to the specified excitation. For example, a corrective excitation can be determined, which is added to the determined excitation of the defective deflection element in order to calculate the modified excitation, wherein the corrective excitation is as great as the difference between the specified excitation and the determined excitation.

According to exemplary embodiments, modifying the determined excitations for the deflection elements of a multipole element includes adding corrective excitations to the determined excitations.

According to further exemplary embodiments, the corrective excitations can be the same for all deflection elements of the defective multipole element.

According to further exemplary embodiments, although the corrective excitations are the same for all deflection elements of a given defective multipole element, they can however differ for different defective multipole elements.

According to exemplary embodiments, the corrective excitations can be calculated as the difference between the specified excitation of the defective deflection element and the excitation of the deflection element that was determined as explained above.

For example, the deflection elements of the defective multipole element can be excited with the modified excitations if the modified excitation of the defective deflection element matches the excitation specified on the basis of the defect. For example, it is possible in this way to excite the multipole element operated, for example, as a stigmator in such a way that it provides a desired stigmatic or deflecting effect on the particle beam passing through the defective multipole element in almost the same way as with an intact stigmator. It is possible here that the multipole element excited with the modified excitations provides a further effect on the particle beam passing through it that the intact multipole element excited with the determined excitations would not provide. In some situations when using the multi-aperture plate with the defective multipole element, however, it is possible that the multi-beam particle beam system can be operated successfully with the defective multipole element despite that additional effect.

For example, adding the same corrective excitation to all excitations of a multipole element leads to a change in substantially only the focusing effect of the multipole element on the particle beam, but not in its deflection or stigmation effects. The inventors have furthermore found that the change in focusing that typically occurs here is often negligible in practice, while the deflection and stigmation effects, which normally change greatly with comparatively small changes in the excitations, remain substantially unchanged.

It is thus also possible to use multi-aperture plates having multipole elements with specific defects for the multi-beam particle beam system, which is why specific production errors in the multi-aperture plates lead to usable multi-aperture plates and not to rejects. The rejection rate arising during the production of the multi-aperture plates can thus be reduced. If a defect occurs during the operation of the multi-beam particle beam system, the excitation of the deflection elements of the multipole elements of the multi-aperture plate can furthermore be changed in such a way that the previously explained modified excitations are supplied to the deflection elements of a now defective multipole element. It is thus possible that multi-beam particle beam systems can continue to be operated even after defects in multipole elements of a multi-aperture plate have occurred and the multi-aperture plate does not have to be replaced.

According to further embodiments of the disclosure, a multi-beam particle beam system includes a plurality of multi-aperture plates, each of which has a multiplicity of openings, wherein at least one controllable deflection element is provided for a first subset of the openings in each of the plurality of multi-aperture plates, and wherein the plurality of multi-aperture plates are arranged one behind the other in the beam path. A multi-beam particle source is provided for generating a multiplicity of particle beams in such a way that each particle beam successively passes through the plurality of multi-aperture plates through their openings.

The at least one deflection element can include, for example, an electrode, which is connected to a voltage source in order to supply a settable voltage to the electrode in order to generate an electric field or to change an existing electric field that has a deflecting effect on the particles of the particle beam passing through the opening. The at least one deflection element can further include, for example, a coil, which is connected to a current source in order to supply a settable current to the coil in order to generate a magnetic field or to change an existing magnetic field which has a deflecting effect on the particles of the particle beam passing through the opening.

For example, precisely one deflection element can be provided at the opening, which one deflection element deflects the particles of the particle beam passing through the opening in such a way that a focusing or defocusing effect is exerted on it. Furthermore, for example, two deflection elements may be provided at the opening, which two deflection elements deflect the particles of the particle beam passing through the opening in such a way that a deflecting effect is exerted on it in addition to a focusing or defocusing effect. Furthermore, for example, four deflection elements can be provided at the opening, which four deflection elements deflect the particles of the particle beam passing through the opening in such a way that a focusing or defocusing effect and a deflecting effect are exerted on it, the orientation of which is settable. Furthermore, for example, eight deflection elements can be provided at the opening, which eight deflection elements deflect the particles of the particle beam passing through the opening in such a way that a focusing or defocusing effect and a deflection or stigmation effect are exerted on it, the orientation of which is settable.

According to exemplary embodiments, the first subsets of the openings in the plurality of multi-aperture plates are arranged in such a way that each particle beam passes through exactly one opening in the plurality of multi-aperture plates at which the at least one controllable deflection element is provided.

The plurality of multi-aperture plates can have the same construction to the extent that the number and the arrangement of their openings are the same. This makes it possible for each particle beam of the multiplicity of particle beams to pass through an opening in a first multi-aperture plate of the plurality of multi-aperture plates, then to pass through an opening in a second multi-aperture plate of the plurality of multi-aperture plates and, if the number of the plurality of multi-aperture plates is greater than two, to correspondingly pass through openings in further multi-aperture plates. The plurality of multi-aperture plates differ in that, with the same arrangement of the openings in the plurality of multi-aperture plates, the respective arrangements of the openings that have controllable deflection elements are different. In each of the plurality of multi-aperture plates, the number of openings that have controllable deflection elements is less than the number of the particle beams.

The plurality of multi-aperture plates together have an effect on the multiplicity of particle beams that corresponds to the effect of a conventional multi-aperture plate having at least one deflection element at each of the openings through which a particle beam passes. Owing to the lower number of controllable deflection elements per multi-aperture plate compared to a conventional multi-aperture plate, the desired properties for the supply of excitations to the deflection elements of the multi-aperture plate are lower. This can in each case simplify the production of the plurality of multi-aperture plates, enable a larger number of openings through which particle beams pass, and enable a greater density of the openings through which particle beams pass.

According to exemplary embodiments, a second subset of openings that are not included in the first subset and have at least one deflection element is provided in at least one of the plurality of multi-aperture plates, although an excitation of this at least one deflection element is specified and is not independently settable. This makes it possible, for example, to produce all openings in the plurality of multi-aperture plates, as far as the production of the deflection elements is concerned, according to the same production method. However, the openings of the first and the second subset differ in that the deflection elements of the openings of the second subset are not excitable, for example by no supply lines being provided to supply excitations to the deflection elements of the openings of the second subset.

According to exemplary embodiments of the disclosure, a method for operating a multi-beam particle beam system, which has a multi-aperture plate with openings, on each of which at least one electrode is provided as a deflection element, includes determining at least one deflection element that is defective and supplying a high-voltage pulse to the defective deflection element to correct the defect.

Multi-aperture plates for multi-beam particle beam systems can be microelectromechanical systems (MEMS), which have a dense network of conductor tracks with structure sizes in the micrometer range. Typically, a multi-aperture plate includes a substrate made of doped silicon, which is a conductive material. A layer of $SiO_2$, which acts as an insulator, is applied to the substrate. The conductor tracks are formed by an aluminum layer, which was applied to the $SiO_2$ layer and structured using lithographic methods. The conductor tracks are used, for example, to supply electric potentials or electric currents to the deflection elements, which are provided at openings in the multi-aperture plate. In order to provide this function, it is desirable that the conductor tracks are not interrupted and, in addition, that the conductor tracks are not in contact with the electrically conductive substrate.

It has been shown that finished multi-aperture plates occasionally have short circuits between the conductor tracks and the conductive substrate. One cause may be that the insulating $SiO_2$ layer is too thin and therefore has a finite resistance. A resulting current flow between the conductor track and the substrate can be so great that a voltage or current source for providing the excitations that are to be supplied to the deflection elements is overloaded. It may be the case that the insulating $SiO_2$ layer is not uniformly thin, but rather is too thin in some localized regions for manufacturing reasons. It is assumed that the behavior of the electrical resistance between the conductor track and the substrate in these regions has the characteristic of a Schottky contact.

The inventors have found that the application of short high-voltage pulses to a defective conductor track can eliminate a short circuit between the conductor track and the substrate. The inventors assume that the current caused by the short high-voltage pulse between the conductor track and the substrate heats the defect and the insulating $SiO_2$ layer increases in size in the region of the defect and becomes sufficiently insulating again. The application of voltages from a range between 1 kV and 10 kV for a time period of between 0.01 ms and 5.0 ms, for example between 0.1 ms and 1.0 ms, has proven to be advantageous here.

According to exemplary embodiments of the disclosure, a multi-beam particle beam system includes at least one multi-aperture plate having a multiplicity of openings, wherein at least one controllable deflection element is provided at each of the openings in the at least one multi-aperture plate, and a voltage supply system, which is configured to supply settable excitations to the deflection elements of the at least one multi-aperture plate via supply lines. This means that during the operation of the multi-beam particle beam system, a settable excitation can be supplied from the voltage supply system to each deflection element of the at least one multi-aperture plate. The openings in the multi-aperture plate are able to be assigned to a plurality of groups of openings, wherein each opening that is contained in one group of openings is not contained in another of the groups of openings. This means that a plurality of the groups under consideration do not contain common openings, or that the groups are disjoint. This possible division of the openings into groups applies to a plurality of the openings in the multi-aperture plate, but not necessarily to all openings in the multi-aperture plate. For example, the division into groups applies to more than half of the openings in the multi-aperture plate.

According to exemplary embodiments, all openings of any given group of openings each have at least one deflection element, which is connected to a given supply line, with the result that deflection elements of a plurality of openings of the same group are jointly connected to this given supply line.

In a conventional multi-beam particle beam system, it is typical that all deflection elements of all openings in a multi-aperture plate are able to be supplied with excitations that are settable independently of one another. This ensures that each particle beam passing through an opening in the multi-aperture plate can be influenced by the electric and/or magnetic fields provided by the deflection elements in exactly the way that is desired for the particle beam. The inventors have found that, in practice, many deflection elements have to be supplied with the same or similar excitations in order to influence the particle beams with regard to compensating for imaging aberrations of other optical elements in the beam path of the particle beams. The inventors have found that if the openings have a plurality of deflection elements, for example in order to stigmatically influence the particle beam passing through the opening, adjacent openings receive the same or similar excitation patterns in order to influence the particle beams passing through the adjacent openings as desired.

The embodiment explained above therefore provides for common supply lines to be provided for deflection elements of different openings that belong to the same group. The same excitation is thus supplied to the deflection elements that are connected to the common supply line, which means that the excitations of these deflection elements can no longer be set independently of one another. However, in return, the number of supply lines used to supply the excitations to the deflection elements of the openings in the multi-aperture plate can be significantly reduced. Nevertheless, it is possible to excite the deflection elements almost as is ideally desired, since the groups of openings can be selected such that at least some deflection elements of the openings of the same group can be supplied with the same excitations.

According to exemplary embodiments, multiple openings of any given group each have an opening as a nearest neighbor that likewise belongs to the given group of openings. That means that in the plane of the multi-aperture plate, closely adjacent openings belong to a common group. This is based on the consideration that the mutually adjacent openings in the multi-aperture plate involve similar excitations for their deflection elements in order to influence the particle beams passing through this opening for example with regard to compensating for an imaging aberration of an optical unit through which the particle beams pass. According to exemplary embodiments, a number of the openings that belong to the same group of openings lies, in arithmetic mean over all groups of openings in the multi-aperture plate, in a range between 2.0 and 3.0.

According to exemplary embodiments, the openings of any given group and, for example, the openings of all groups of openings have an equal number of deflection elements, for example eight deflection elements, which are arranged distributed in the circumferential direction around the opening.

BRIEF DESCRIPTION OF THE DRAWINGS

Embodiments of the disclosure are explained in greater detail below on the basis of figures, in which.

DESCRIPTION OF EXEMPLARY EMBODIMENTS

Figure 1:
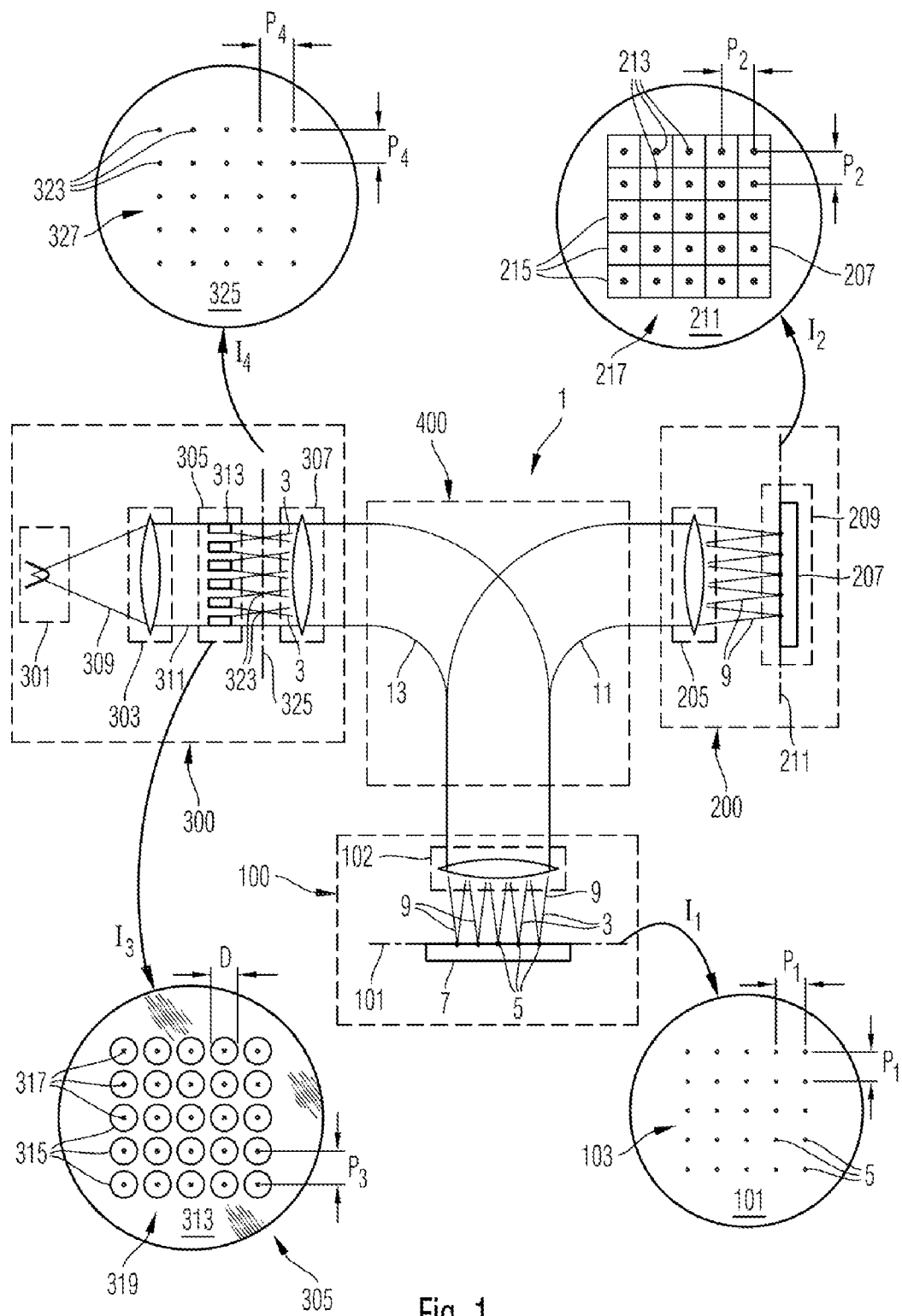
FIG. 1 shows a schematic illustration of a multi-beam particle beam system.

FIG. 1 is a schematic illustration of a multi-beam particle beam system 1, which operates with a multiplicity of particle beams. The multi-beam particle beam system 1 generates a multiplicity of particle beams, which are incident on an object to be examined in order to generate there electrons that emanate from the object and are subsequently detected. The multi-beam particle beam system 1 is of the scanning electron microscope (SEM) type, which uses a plurality of primary electron beams 3 that are incident at locations 5 on a surface of the object 7 and generate a plurality of electron beam spots there. The object 7 to be examined can be of any desired type and include for example a semiconductor wafer, a biological sample, and an arrangement of miniaturized elements or the like. The surface of the object 7 is arranged in an object plane 101 of an objective lens 102 of an objective lens system 100.

The enlarged detail I1 in FIG. 1 shows a plan view of the object plane 101 having a regular rectangular field 103 of incidence locations 5 formed in the plane 101. In FIG. 1, the number of incidence locations is 25, which form a 5×5 field 103. The number 25 of incidence locations is small for reasons of simplified illustration. In practice, the number of beams or incidence locations can be chosen to be significantly greater, such as, for example, 20×30, 100×100 and the like.

In the embodiment illustrated, the field 103 of incidence locations 5 is a substantially regular rectangular field having a constant spacing P1 between adjacent incidence locations. Exemplary values of the spacing P1 are 1 micrometer, 10 micrometers, and 40 micrometers. However, it is also possible for the field 103 to have other symmetries, such as a hexagonal symmetry, for example.

A diameter of the beam spots formed in the object plane 101 can be small. Exemplary values of the diameter are 1 nanometer, 5 nanometers, 100 nanometers, and 200 nanometers. The focusing of the particle beams 3 for shaping the beam spots 5 is implemented by the objective lens system 100.

The particles striking the object generate electrons that emanate from the surface of the object 7. The electrons emanating from the surface of the object 7 are shaped by the objective lens 102 to form electron beams 9. The inspection system 1 provides an electron beam path 11 in order to feed the multiplicity of electron beams 9 to a detection system 200. The detection system 200 includes an electron optical unit having a projection lens arrangement 205 to direct the electron beams 9 onto an electron multi-detector 209.

The detail I2 in FIG. 1 shows a plan view of a plane 211, in which lie individual detection regions on which the electron beams 9 are incident at locations 213. The incidence locations 213 lie in a field 217 with a regular spacing P2 from one another. Exemplary values of the spacing P2 are 10 micrometers, 100 micrometers, and 200 micrometers.

The primary electron beams 3 are generated in a beam generating device 300 including at least one electron source 301, at least one collimation lens 303, a multi-aperture arrangement 305, and a field lens 307. The electron source 301 generates a diverging electron beam 309, which is collimated by the collimation lens 303 to form a beam 311, which illuminates the multi-aperture plate arrangement 305.

The detail I3 in FIG. 1 shows a plan view of the multi-aperture plate arrangement 305. The multi-aperture plate arrangement 305 includes a multi-aperture plate 313, which has a plurality of openings 315 formed therein. Midpoints 317 of the openings 315 are arranged in a field 319 corresponding to the field 103, which is formed by the beam spots 5 in the object plane 101. A spacing P3 between the midpoints 317 of the openings 315 can have exemplary values of 5 micrometers, 100 micrometers, and 200 micrometers. The diameters D of the openings 315 are smaller than the spacing P3 between the midpoints of the openings. Exemplary values of the diameters D are 0.2×P3, 0.4×P3, and 0.8× P3.

Electrons of the illuminating beam 311 pass through the openings 315 and form electron beams 3. Electrons of the illuminating beam 311 that are incident on the plate 313 are absorbed by the latter and do not contribute to the formation of the electron beams 3.

The multi-aperture plate arrangement 305 can focus the electron beams 3 in such a way that beam foci 323 are formed in a plane 325. A diameter of the foci 323 can be, for example, 10 nanometers, 100 nanometers, and 1 micrometer.

The field lens 307 and the objective lens 102 provide a first imaging particle optical unit for imaging the plane 325 in which the foci are formed onto the object plane 101, such that a field 103 of incidence locations 5 or beam spots is formed there on the surface of the object 7.

The objective lens 102 and the projection lens arrangement 205 provide a second imaging particle optical unit for imaging the object plane 101 onto the detection plane 211. The objective lens 102 is thus a lens that is part of both the first and the second particle optical unit, while the field lens 307 belongs only to the first particle optical unit and the projection lens arrangement 205 belongs only to the second particle optical unit.

A beam switch 400 is arranged in the beam path of the first particle optical unit between the multi-aperture plate arrangement 305 and the objective lens system 100. The beam switch 400 is also part of the second particle optical unit in the beam path between the objective lens system 100 and the detection system 200.

Further information relating to such multi-beam particle beam systems and components used therein, such as, for instance, particle sources, multi-aperture plates, and lenses, can be obtained from the international applications WO 2005/024881, WO 2007/028595, WO 2007/028596 and WO 2007/060017 A2, and the German patent applications DE 10 2013 016 113 A1, DE 10 2013 014 976 A1 and DE 10 2014 008 083 A1, the disclosure of which is incorporated by reference in its entirety in the present application.

Figure 2:
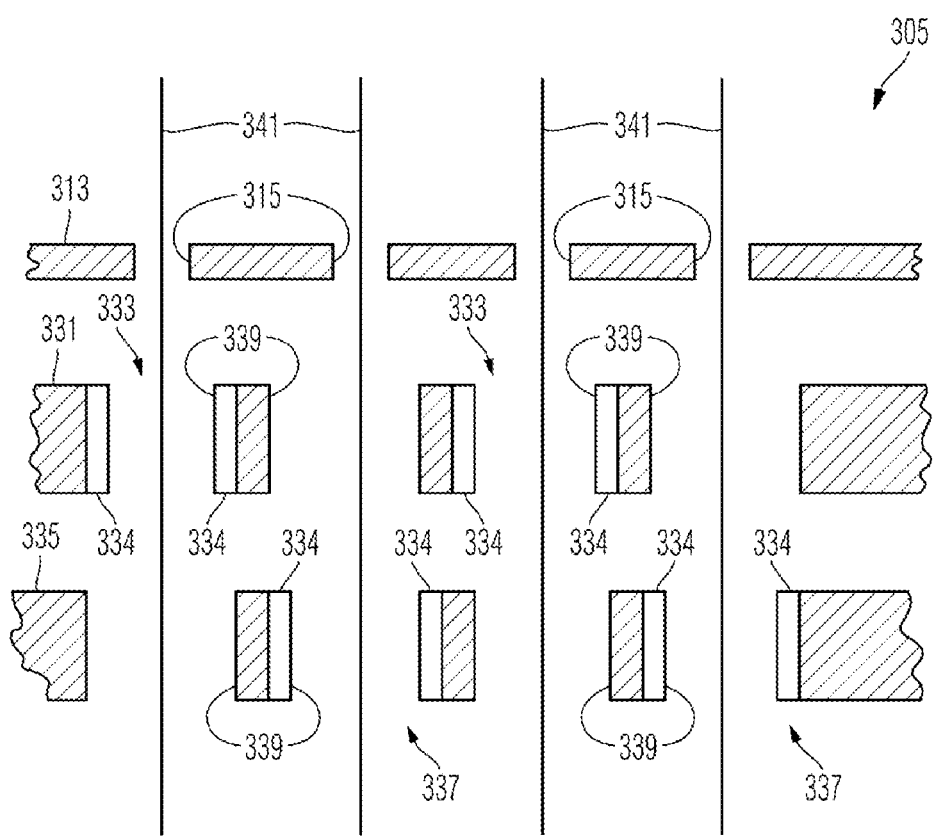
FIG. 2 shows a schematic cross-sectional illustration of an arrangement composed of a plurality of multi-aperture plates.

FIG. 2 is a partial cross-sectional view of the multi-aperture plate assembly 305. It includes the multi-aperture plate 313 already explained above, which, with its openings 315, is used to form the multiplicity of particle beams 3 from the illuminating particle beam 311. The multi-aperture plate arrangement 305 further includes a plurality of further multi-aperture plates. The number of the plurality of further multi-aperture plates in the example explained is two.

The two further multi-aperture plates are a first multi-aperture plate 331 with stigmators 333 and a second multi-aperture plate 335 with stigmators 337. The multi-aperture plate 331 is arranged in the beam path downstream of the multi-aperture plate 313, and the multi-aperture plate 335 is arranged in the beam path downstream of the multi-aperture plate 331. Each of the multi-aperture plates 331 and 335 has a multiplicity of openings 339 through which the particle beams formed in the beam path downstream of the multi-aperture plate 313 pass. For this purpose, a center of an opening 315 in the multi-aperture plate 313, a center of an opening 339 in the multi-aperture plate 331, and a center of an opening 339 in the multi-aperture plate 335 are arranged along a beam axis 341 for each particle beam, with the result that the particle beams successively pass through the openings 315 in the multi-aperture plate 313, the openings 339 in the multi-aperture plate 331, and the openings 339 in the multi-aperture plate 335. In FIG. 2, the beam axes 341 are oriented orthogonally to the multi-aperture plate 331, since the particle beam 311 illuminating the multi-aperture plate 313 is a parallel beam. However, it is also possible for the particle beam to be a convergent or divergent beam, which means that the beam axes 341 are not all oriented orthogonally to the multi-aperture plate 313.

The stigmators 333 of the first multi-aperture plate 331 and the stigmators 337 of the second multi-aperture plate 335 are each formed by eight deflection elements 334, which are arranged distributed in the circumferential direction around the openings 339.

Not all openings 339 of the multi-aperture plates 331 and 335 are provided with stigmators 333 and 337, respectively. Accordingly, deflection elements 334 are not provided at each of the openings 339 of the multi-aperture plates 331 and 335. Rather, deflection elements 334 are provided at a first subset of the openings 339 of the first multi-aperture plate 331 and also at a first subset of the openings 339 of the second multi-aperture plate 335. The subsets of the openings 339 of the multi-aperture plates 331 and 335, at which deflection elements 334 are provided, meet the following criterion: Each particle beam that passes through openings 339 of the first multi-aperture plate 331 and the second multi-aperture plate 335 passes through exactly one opening 339 at which deflection elements 334 are provided.

Figure 3:
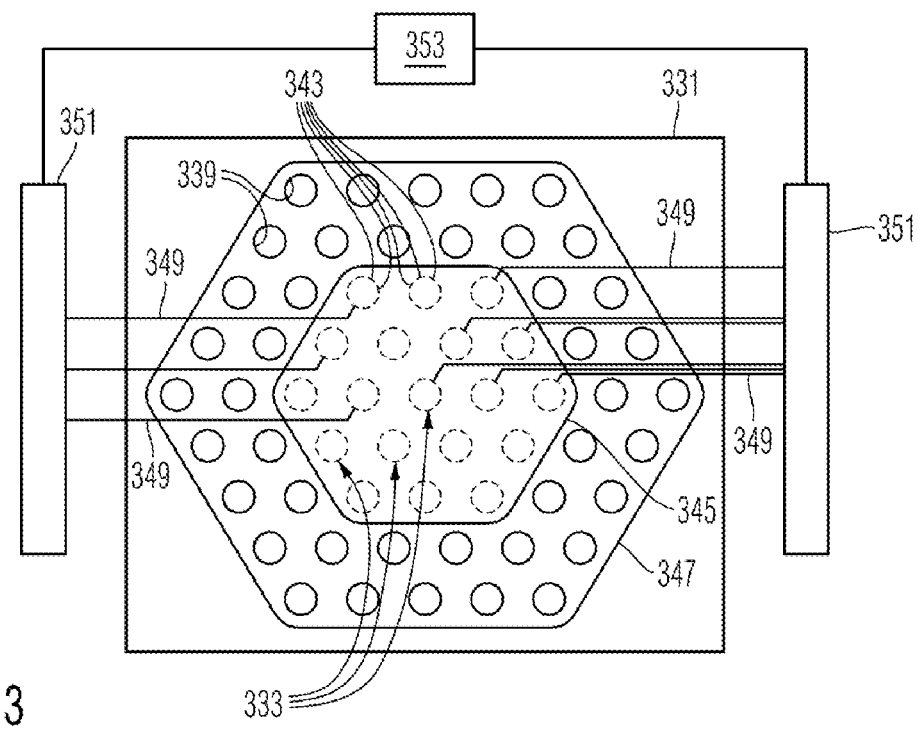
FIG. 3 shows a plan view of a first multi-aperture plate of the illustration in FIG. 2.
Figure 4:
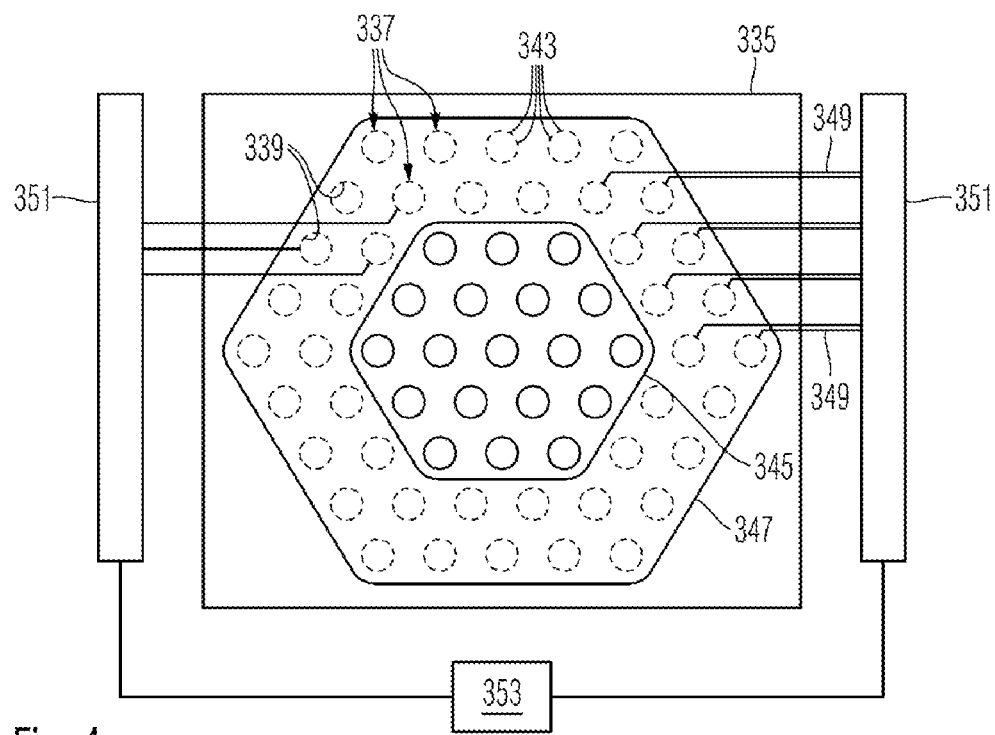
FIG. 4 shows a plan view of a second multi-aperture plate from FIG. 2.

FIG. 3 shows a plan view of the first multi-aperture plate 331 with the stigmators 333, and FIG. 4 shows a plan view of the second multi-aperture plate 335 with the stigmators 337. It can be seen from FIGS. 3 and 4 that the first and second multi-aperture plates 331, 335 each have 61 openings 339, which are arranged in a hexagonal pattern. Both multi-aperture plates 331 and 335 have openings 339 at which deflection elements 334 are provided, which are arranged distributed in the circumferential direction around the respective opening 339. However, both multi-aperture plates 331 and 335 also have openings 339 at which no deflection elements 334 are arranged. A line 345 in FIG. 3 encloses the subset of openings 339 in the first multi-aperture plate 331 that are provided with deflection elements 334. This first subset of openings 339 are 19 openings 339 of the first multi-aperture plate 331, which are arranged centrally in the hexagonal pattern of the openings 339. A line 347 in FIG. 3 encloses all the openings 339 of the first multi-aperture plate 331. The openings 339 arranged outside the line 345 and within the line 347 form a second subset of openings 339, at which no deflection elements 334 are provided. The openings 339 of the second subset of openings 339 of the first multi-aperture plate 331 lie at the edge of the hexagonal arrangement of openings 339.

The lines 345 and 347 are also shown in FIG. 4. However, in this case the openings 339 that belong to the first subset of openings 339 at which deflection elements 334 are provided are arranged outside the line 345 and within the line 347, while the openings 339 of the second subset with openings 339 that have no deflection elements 334 are located within the line 345. It is evident that the arrangement of the first and the second subset of openings 339 at the first multi-aperture plate 331 is complementary to the arrangement of the first and the second subset of the second multi-aperture plate 335, which means that the condition that each particle beam passes through exactly one opening in the two multi-aperture plates 331 and 335 at which deflection elements 334 are provided is met.

Each of the two multi-aperture plates 331 and 335 includes supply lines 349 in order to supply settable excitations, which are provided by supply circuits 351, to the deflection elements 334. Only a few of the supply lines 349 are shown in FIGS. 3 and 4. If the deflection elements 334 are electrodes for generating electric fields, the supply circuits 351 are a voltage supply mechanism. If the deflection elements 334 are coils for generating magnetic fields, the supply circuits 351 are a current supply mechanism. The supply circuits 351 are controlled by a controller 353 in order to supply suitable excitations to the deflection elements 334. It is evident that the number of the supply lines 349 for exciting the deflection elements 334 is a multiple of the number of the openings 339 of the first subset. However, since the number of the openings 339 of the first subsets of the respective multi-aperture plates 331 or 335 is less than the total number of openings 339 of the respective multi-aperture plate 331 or 335, the number of supply lines 349 that are to be provided at one of the two multi-aperture plates 331 and 335, is significantly lower compared to a conventional multi-aperture plate in which all openings 339 have controllable deflection elements.

According to an exemplary embodiment not shown in the figures, which is a modification of the multi-aperture plate arrangement 305 explained with reference to FIGS. 2, 3 and 4, the deflection elements 334 are provided at all the openings 339. For example, deflection elements 334 are also provided at the openings 339 of the second subsets of openings 339 of the plurality of multi-aperture plates 331, 335. However, the deflection elements 334 of the second subset of openings 339 are not controllable in this modified exemplary embodiment either because the deflection elements are not connected to the voltage sources or current sources 351 by way of line connections 349.

Figure 5:
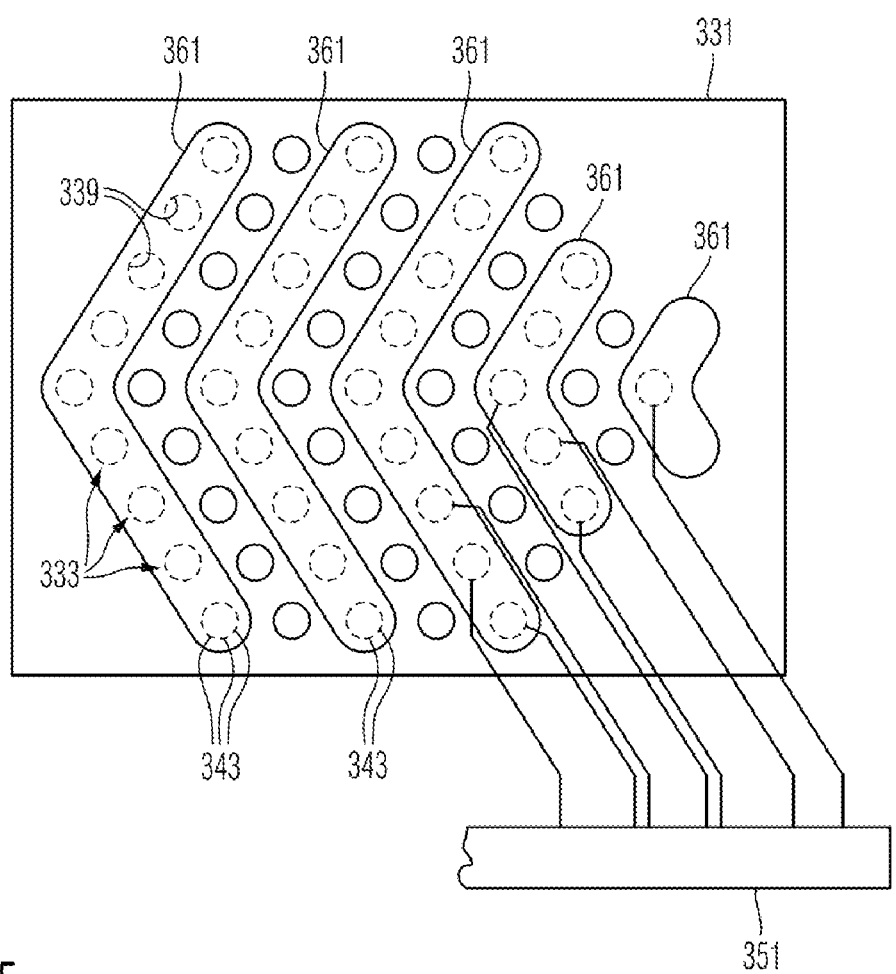
FIG. 5 shows a schematic plan view of a variant of the multi-aperture plates of FIGS. 3 and 4.

FIG. 5 shows a further modification of the multi-aperture plate arrangement 305 explained with reference to FIGS. 2 to 4, which differs from the multi-aperture plate arrangement of FIGS. 2 to 4 in the way in which the first and second subsets of openings are arranged on the multi-aperture plates. FIG. 5 shows a plan view of the first multi-aperture plate 331 with stigmators 333. Lines 361 in FIG. 5 each enclose a group of openings 339 of a first subset of openings 339, which are provided with controllable deflection elements 334, while a second subset of openings 339 not enclosed by the lines 361 does not have controllable deflection elements. The groups enclosed by the lines are arranged as arrow-shaped or boomerang-shaped figures. The associated second multi-aperture plate 335 (which is not shown in the figures) has an arrangement of the openings 339 of the first subset that is complementary to the first subset shown in FIG. 5.

In the embodiments described with reference to FIGS. 2 to 5, eight deflection elements are provided at each of the openings, with the result that the multipole elements formed thereby can be operated as stigmators. The explained principles of providing a plurality of multi-aperture plates one behind the other in the beam path in such a way that each particle beam passes through exactly one opening that has at least one deflection element, while the other openings through which this particle beam passes do not have this at least one controllable deflection element, can also be applied to openings that have a deflection element or, for example, two or four deflection elements arranged distributed in the circumferential direction around a center.

Figure 6:
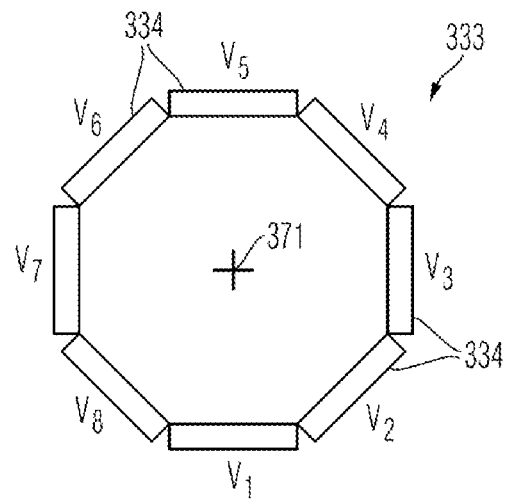
FIG. 6 shows a schematic illustration of an intact multipole element that is excited with determined excitations.

FIG. 6 is a schematic illustration of a plan view of deflection elements 334, which are arranged distributed in the circumferential direction around a center 371 of an opening in a multi-aperture plate. The deflection elements 334 together form a stigmator 333 for the targeted compensation of a beam astigmatism of a particle beam passing through the opening. For this purpose, the deflection elements are excited with excitations that are determined such that the beam astigmatism is compensated as far as possible. In the example shown, the deflection elements are electrodes, and the excitations that have been determined for the compensation are voltages $V_1$, $V_2$, ... $V_8$, which are supplied to the individual electrodes 334.

Figure 7:
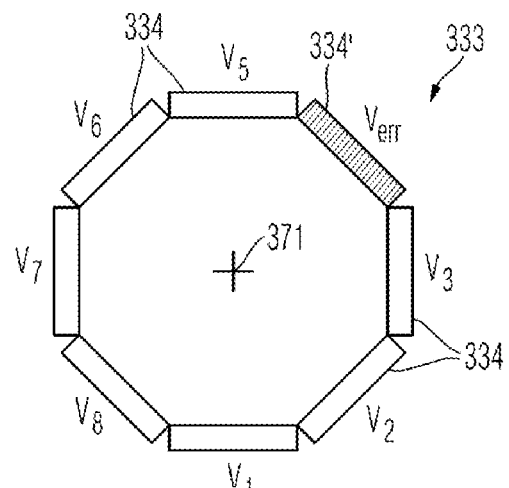
FIG. 7 shows a schematic illustration of a defective multipole element that is excited with the determined excitations of FIG. 6.

FIG. 7 is an illustration of deflection elements 334 corresponding to FIG. 6, but in this case a deflection element designated 334' is defective. For example, the supply line to this deflection element 334' is interrupted, or the deflection element 334' is connected to ground or the like, for example. If the deflection elements or electrodes 334 of FIG. 7 are supplied with the previously determined voltages $V_1$, $V_2$, ... $V_8$ of FIG. 6, the defective electrode 334' cannot assume the voltage $V_4$. On the contrary, because of the defect, this electrode assumes a different voltage, which is designated $V_{err}$ in FIG. 7. It is then not possible to achieve a satisfactory compensation for the aberrations of the particle beam passing through the opening.

Figure 8:
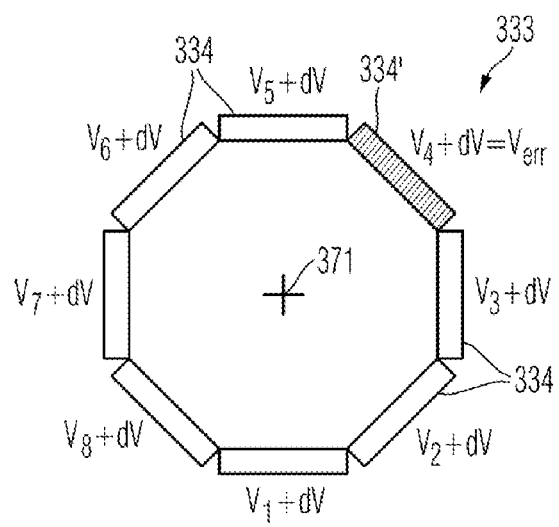
FIG. 8 shows a schematic illustration of the defective multipole element of FIG. 7, which is excited with modified excitations.

FIG. 8 is an illustration of the deflection elements 334 of FIG. 7 with the defective deflection element 334'. However, the deflection elements in FIG. 8 are excited with excitations that have been modified compared to those in FIG. 7 or FIG. 6. The modified excitations are determined by adding corrective excitations to the previously determined excitations of FIG. 6. For example, voltages $V_1$+dV, $V_2$+dV, ... $V_8$ dV are supplied to the electrodes 334. Here, the corrective excitations dV are the same for all deflection elements. The value of the corrective excitation dV is determined such that the following relation is fulfilled: $V_4$+dV=$V_{err}$.

Since the modified voltage to be supplied to the defective electrode 334' is equal to the voltage assumed by the defective electrode due to its defect, it is possible to actually excite the deflection elements with the modified excitations. Furthermore, the differences in the excitations between the individual deflection elements are the same as the differences between the excitations in the deflection elements of the intact deflection elements (see FIG. 6). Since these differences are the same, it is possible for, for example, a beam astigmatism of the particle beam passing through the defective stigmator 333 to be compensated for in exactly the same way as with an intact stigmator. The average value of the modified voltages applied to the electrodes 334 of the defective stigmator 333 in FIG. 8 is higher by the value dV than the average value of the determined voltages applied to the electrodes 334 of the intact stigmator 333 in FIG. 6. Therefore, the modified excitations exert an additional effect of a focusing lens on the beam passing through the defective stigmator 333 of FIG. 8 compared to the beam passing through the intact stigmator 333 of FIG. 6. In some situations, this additional effect can possibly have a disadvantageous effect on the beam, which can be tolerated because the advantageous effect of compensating for the beam astigmatism predominates despite the defective stigmator.

Figure 9:
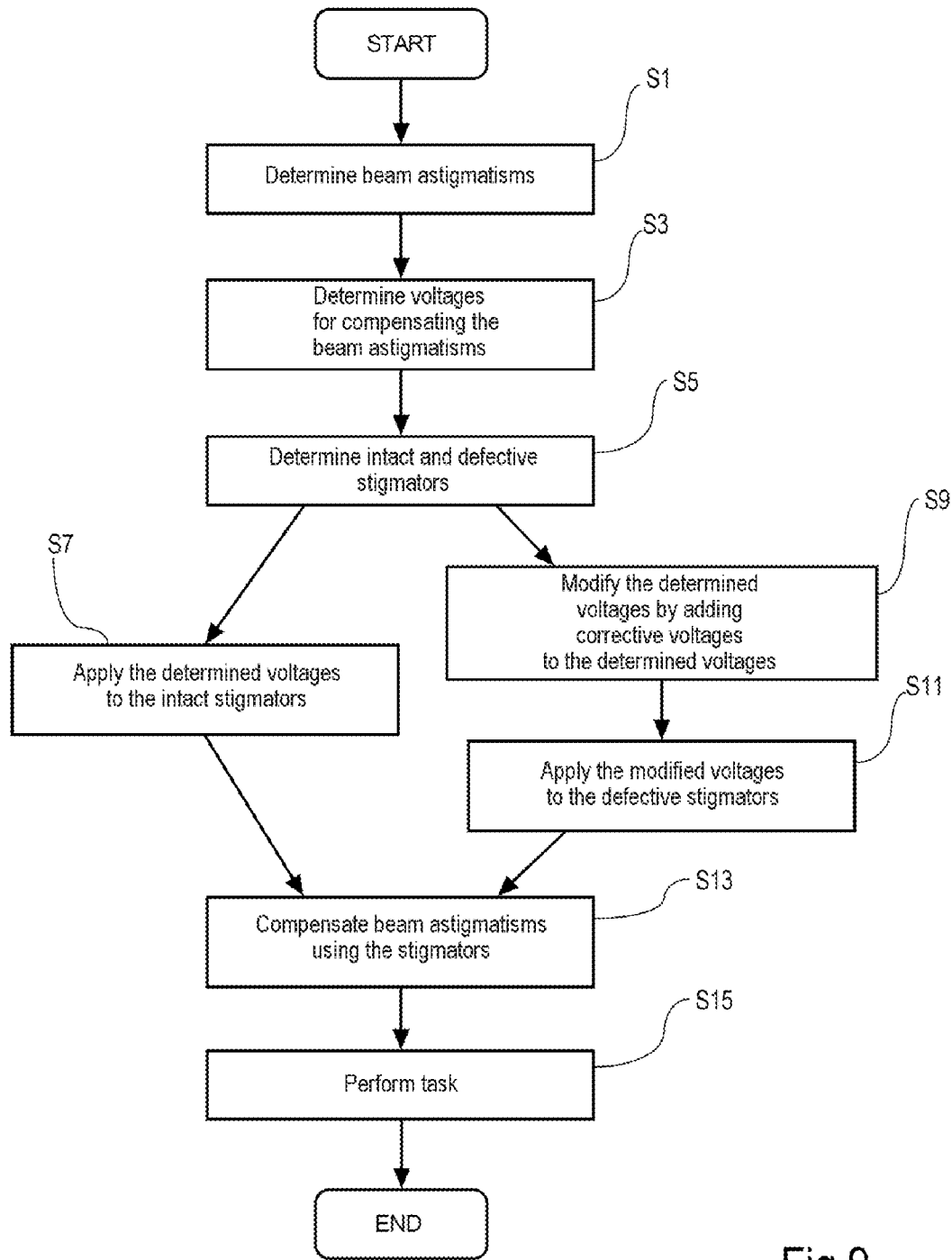
FIG. 9 shows a flow chart for explaining a method for operating a multi-beam particle beam system.

A method for operating a particle beam device will be explained below with reference to the flow chart shown in FIG. 9. At the start, any occurring beam astigmatisms of the multiplicity of particle beams with which the multi-beam particle beam system operates are determined in a step S1. This determination can be made on the basis of measurements carried out with the multi-beam particle beam system. However, it is also possible for the determination to be carried out on the basis of information stored in a database, for example.

In a step S3, voltages are determined that are to be applied to electrodes of stigmators in order to compensate for the beam astigmatisms.

In a step S5 it is determined which stigmators are intact and which stigmators are defective. This determination can again be carried out by measurements on the multi-beam particle beam system. It is also possible that the intact and the defective stigmators are already known and related information is available in a database, which means that the determinations in step S5 can be made by evaluating the information. The database can be held, for example, outside the multi-beam particle beam system, in a control mechanism of the multi-beam particle beam system or in a memory that is arranged at or on the multi-aperture plate with the stigmators.

The voltages determined in step S3 are applied in a step S7 to those stigmators that were identified as being intact stigmators in step S5.

For the stigmators that were identified as being defective stigmators in step S5, voltages modified in step S9 are determined by adding corrective voltages to the voltages determined in step S3.

The modified voltages determined in step S9 are applied to the defective stigmators in a step S11.

After steps S7 and S11 have been carried out, suitable voltages are applied to both the electrodes of the intact stigmators and the electrodes of the defective stigmators so as to suitably influence the particle beams passing through the stigmators in step S13. The multi-beam particle beam system is then ready for use, so that tasks can be carried out with it in a step S15.

In the embodiments described with reference to FIGS. 6 to 9, the multipole elements have eight deflection elements and are operated as stigmators. However, the principles explained of modifying the determined excitations may be applied generally to multipole elements that have at least two deflection elements arranged distributed in the circumferential direction around a center.

Furthermore, in the embodiments described with reference to FIGS. 2 to 9, the deflection elements of the multipole elements are electrodes, which are excited by the application of voltages to generate electric fields, which deflect the particles of the particle beam passing through the multipole element. The modification of the determined excitations may, however, also be applied to multipole elements, the deflection elements of which are coils, which are excited by the application of currents to generate magnetic fields, which deflect particles of the particle beam passing through the multipole element.

Figure 10:
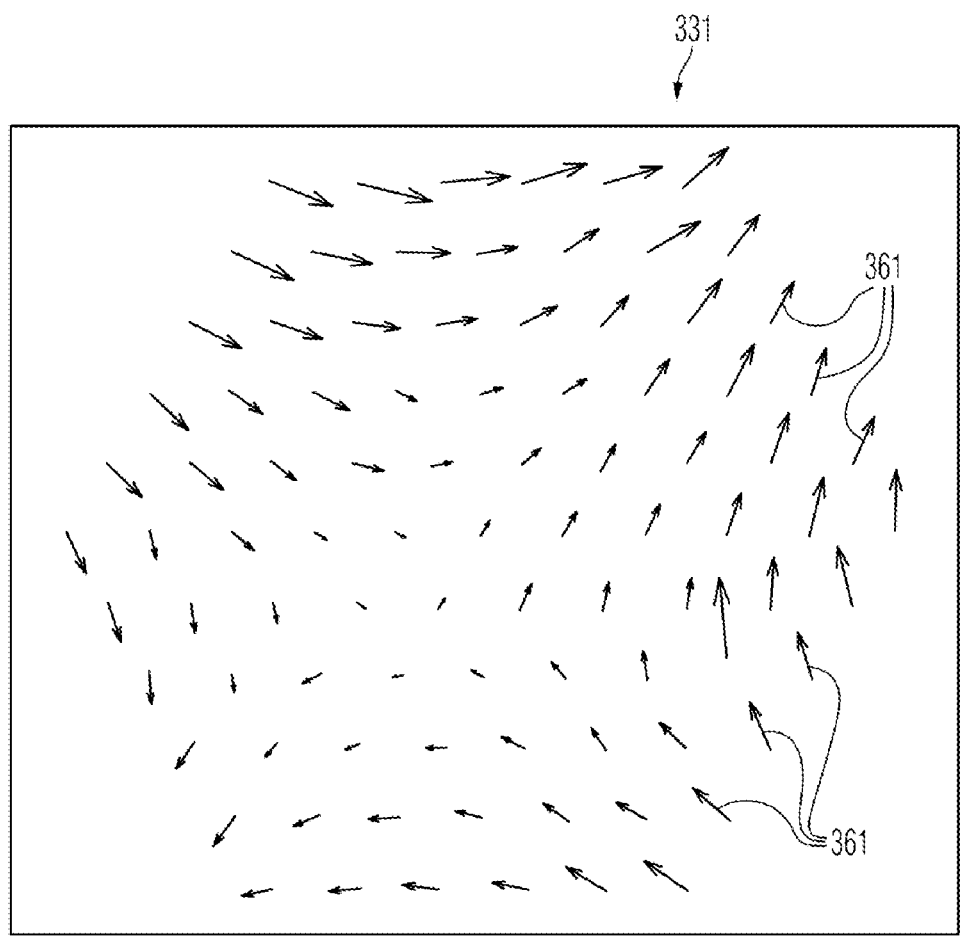
FIG. 10 shows a schematic illustration of beam astigmatisms that are to be corrected for a multiplicity of openings in a multi-aperture plate.

FIG. 10 shows a field of 91 vectors 361. Each of the vectors 361 represents an influence of a particle beam that passes through an opening in a multi-aperture plate 331. The influence is an astigmatic influence, and the vectors 361 represent the strength of the astigmatic influence by their length and the orientation of the astigmatic influence by their direction. In the illustration of FIG. 10, the feet of the vectors are arranged at the center of a respective opening in the multi-aperture plate. It is evident that the openings in the explained multi-aperture plate 331 are arranged in a hexagonal pattern.

Each of the openings in the multi-aperture plate 331 includes eight deflection elements, which are arranged distributed in the circumferential direction around the opening. Settable excitations can be supplied to the deflection elements in order to provide an electric and/or magnetic quadrupole field in the opening with a strength and an orientation such that an astigmatic influence on the particle beam passing through the opening can take place that is settable with regard to its strength and orientation.

It is evident from FIG. 10 that the vectors 361 have a multiplicity of different lengths and different orientations. However, it is also evident that mutually adjacent vectors often have lengths and orientations that do not differ greatly from one another. For this reason, in the embodiment explained here, the same excitation patterns are often supplied to the deflection elements of mutually adjacent openings by using common supply lines for the deflection elements of the adjacent openings.

Figure 11:
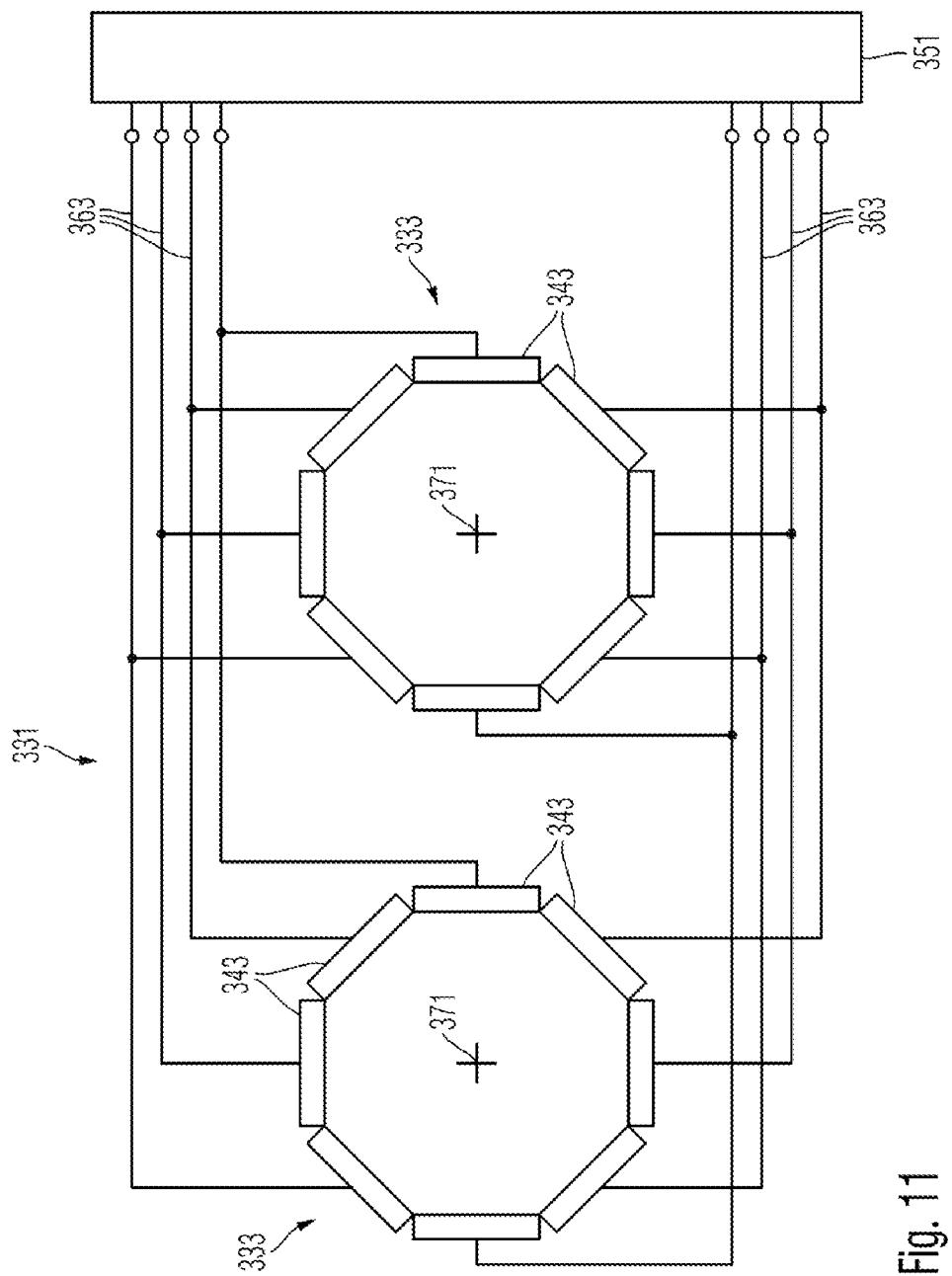
FIG. 11 shows an explanation of an electrical circuit for supplying excitations to deflection elements of different openings through common supply lines.

A circuit for supplying excitations to deflection elements of different openings via common supply lines is shown schematically in FIG. 11. FIG. 11 shows two stigmators 333 each with eight deflection elements 343, which are each arranged in the circumferential direction around a center 371 of an opening in the multi-aperture plate 331. The total number of the deflection elements 343 of the two stigmators 333 is thus sixteen. These sixteen deflection elements 343 are supplied with excitations from a voltage supply system 351 via only eight supply lines 363. The supply lines 363 can be formed on the surface of the multi-aperture plate.

When excitations are supplied through common supply lines 363, it is inevitable that different supply lines cross one another and still have to be insulated from one another. This is possible, for example, by the supply lines being formed in two conductive layers on a substrate of the multi-aperture plate, wherein the conductive layers are insulated from one another and electrically conductive connections can be made between the two layers.

Figure 12:
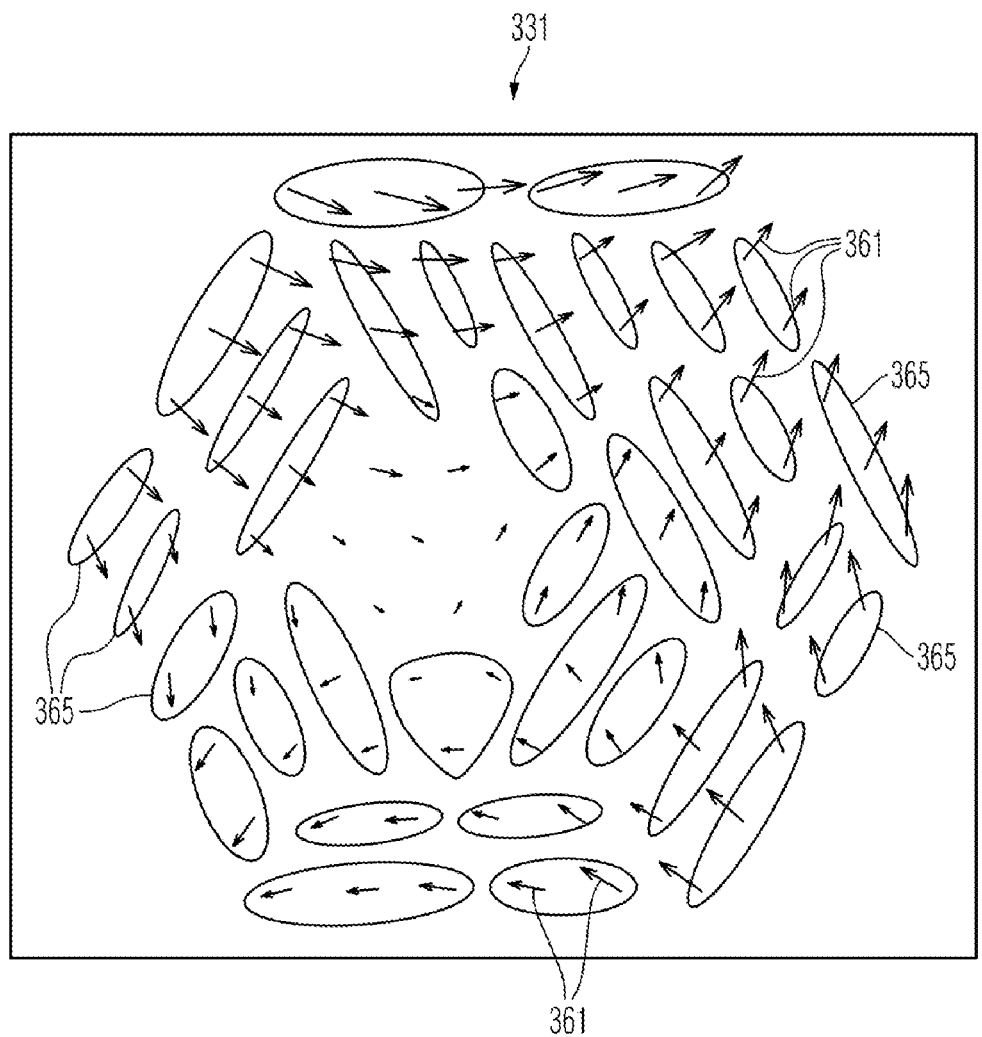
FIG. 12 shows a schematic illustration corresponding to FIG. 10 of a division of openings in the multi-aperture plate into groups.

FIG. 12 is an illustration of the field of the vectors 361 corresponding to FIG. 10 and additionally represents the assignment of openings in the multi-aperture plate 331 to groups 365 of openings. No opening belongs to two different groups 365. Not all openings have to belong to a group 365. For example, seven openings arranged near the center of the multi-aperture plate 331 do not belong to any of the groups 365. The division of the openings into the groups 365 is selected such that the vectors 361 of openings in the same group 365 do not differ greatly from one another with regard to their length and their orientation. Two to three openings each are contained in a group 365. Since the vectors 361 of each group 365 do not differ greatly from one another with regard to their length and orientation, provision is made to supply the deflection elements of openings of each group with excitations through common supply lines, as is shown in FIG. 11 for the deflection elements 343 of a group of two openings. It is then possible at each opening of a given group 365 to influence the particle beam passing through the opening not exactly but almost in the way that is ideally desired and is represented by the field of vectors 361 in FIG. 10.

It has been shown that the division of the openings in a multi-aperture plate into groups, as shown by way of example in FIG. 12, can be retained in many situations in which a multi-beam particle beam system is used. The situations in which it is used can differ, for example, with regard to the kinetic energy of the particle beams passing through the openings in the multi-aperture plate or the particle beams directed at an object by an optical unit arranged in the beam path downstream of the multi-aperture plate. For a plurality of different kinetic energies, the same division of the openings in the multi-aperture plates into groups, as shown by way of example in FIG. 12, would lead to a good result in terms of the ability to influence the particle beams. This means that it can make sense to specify the supply of excitations to the deflection elements of a multi-aperture plate through common supply lines during the production of the multi-aperture plate, to integrate the multi-aperture plate into a multi-beam particle beam system, and then to use the multi-beam particle beam system in a variety of use situations.

What is claimed is:

1. A method, comprising:
   generating a plurality of particle beams such that each particle beam passes through a multipole element, wherein each multipole element comprises a plurality of deflection elements arranged in a circumferential direction around a center of the multipole element, and each multipole element is either intact or defective;
   focusing the particle beams in a predetermined plane;
   determining excitations for the deflection elements of the multipole elements to influence the particle beams passing through the multipole elements, wherein the excitations for the deflection elements of each multipole element are determined such that focusing of each particle beam in the predetermined plane satisfies a predetermined criterion;

exciting the deflection elements of the multipole elements that are intact with the determined excitations;

modifying the determined excitations for the deflection elements of at least one multipole element of the multipole elements that are defective; and exciting the deflection elements of the defective multipole element with the modified excitations, wherein modifying the determined excitations comprises adding corrective excitations to the determined excitations, and the corrective excitations are the same for all deflection elements of the defective multipole element.

2. The method of claim 1, wherein:

the defective multipole element comprises a defective deflection element, the excitation of which is not settable and is a specified excitation prescribed by the defect; and modifying the determined excitations comprises determining the corrective excitations such that the excitation for the defective deflection element is equal to the specified excitation.

3. The method of claim 1, wherein:

the deflection elements comprise electrodes;

determining the excitations comprises determining voltages; and exciting the electrodes comprises applying the voltages to the electrodes.

4. The method of claim 1, further comprising checking the multipole elements, and determining the intact multipole elements and the defective multipole elements based on the check.

5. The method of claim 1, further comprising evaluating a provided data set, and determining the intact multipole elements and the defective multipole elements on the basis of the evaluation of the provided data set.

6. The method of claim 1, further comprising determining variables representing a desired influencing of the particle beam passing through the multipole element for each of the multipole elements.

7. The method of claim 6, wherein determining the excitations for the deflection elements of the multipole element is performed such that, when the deflection elements of the multipole element are excited with the determined excitations, the desired influencing of the particle beam passing through the multipole element is achieved.

8. The method of claim 6, wherein the variables comprise an astigmatism of the particle beam that is to be compensated.

9. A multi-beam particle beam system, comprising:

a plurality of multi-aperture plates arranged one behind the other along a beam path, each multi-aperture plate comprising a multiplicity of openings;

a controllable deflection element for a first subset of the openings in each of the plurality of multi-aperture plates; and a multi-beam particle source configured to generate a multiplicity of particle beams so that each particle beam successively passes through the plurality of multi-aperture plates through their openings, wherein the first subsets of the openings in the plurality of multi-aperture plates are configured so that, during use of the multi-beam particle beam system, each particle beam passes through exactly one opening in the plurality of multi-aperture plates at which the at least one controllable deflection element is provided.

10. The multi-beam particle beam system of claim 9, further comprising a controller configured to excite the at least one controllable deflection element with settable excitations.

11. The multi-beam particle beam system of claim 9, further comprising a deflection element in a second subset of the openings in at least one multi-aperture plate of the plurality of multi-aperture plates, wherein excitation of the deflection element is specified and not settable.

12. The multi-beam particle beam system of claim 9, wherein the controllable deflection element comprises an electrode connected in an electrically conductive manner to a voltage supply system.

13. The multi-beam particle beam system of claim 9, comprising:

a multi-aperture plate that has a multiplicity of openings;

a plurality of controllable deflection elements configured so that a controllable deflection element is at each openings in the multi-aperture plate; and a voltage supply system configured to supply settable excitations to the deflection elements via supply lines, wherein:

a plurality of the openings in the multi-aperture plate are assignable to a plurality of groups of openings;

each opening contained in one of the groups of openings is not contained in any other of the groups of openings; and for each openings of any given group of openings, the opening has at least one deflection element connected to a given supply line such that a plurality of deflection elements are jointly connected to the given supply line.

14. The multi-beam particle beam system of claim 13, wherein, for each opening of any given group of the plurality of groups, its nearest neighbors belong to the given group of openings.

15. A multi-beam particle beam system, comprising:

a multi-aperture plate that has a multiplicity of openings;

a plurality of controllable deflection elements configured so that a controllable deflection element is at each openings in the multi-aperture plate; and a voltage supply system configured to supply settable excitations to the deflection elements via supply lines, wherein:

a plurality of the openings in the multi-aperture plate are assignable to a plurality of groups of openings;

each opening contained in one of the groups of openings is not contained in any other of the groups of openings; and for each openings of any given group of openings, the opening has at least one deflection element connected to a given supply line such that a plurality of deflection elements are jointly connected to the given supply line.

16. The multi-beam particle beam system of claim 15, wherein, for each opening of any given group of the plurality of groups, its nearest neighbors belong to the given group of openings.

17. The multi-beam particle beam system of claim 15, wherein, for each opening, the opening has an identical multiplicity of deflection elements distributed in a circumferential direction around the opening.

18. The multi-beam particle beam system of claim 17, wherein each opening has eight deflection elements.

19. The multi-beam particle beam system of claim 15, wherein, over all groups, an arithmetic mean of a number of openings that belong to the same group of openings is from two to three.

20. The multi-beam particle beam system of claim 15, further comprising:
- a multi-beam particle source configured to generate a multiplicity of particle beams so that each particle beam passes through an opening in the multi-aperture plate;
- a particle source configured to generate particles that partly pass through the openings in the multi-aperture plate; and
- a plurality of lenses in the beam path downstream of the multi-aperture plate,
- wherein the deflection elements of the openings in the multi-aperture plate are connected to the supply lines, and the voltage supply system is configured so that the deflection elements of each opening influence the particle beam passing through the opening so that a field astigmatism generated by the plurality of lenses is compensated.

* * * * *